(12) United States Patent
Fukumoto et al.

(10) Patent No.: US 8,365,554 B2
(45) Date of Patent: Feb. 5, 2013

(54) MOLDING DIE, METHOD FOR MANUFACTURING THE SAME AND METHOD FOR MANUFACTURING GLASS GOB AND MOLDED GLASS ARTICLE

(75) Inventors: Naoyuki Fukumoto, Amagasaki (JP); Shunichi Hayamizu, Amagasaki (JP)

(73) Assignee: Konica Minolta Opto, Inc., Tokyo (JP)

( * ) Notice: Subject to any disclaimer, the term of this patent is extended or adjusted under 35 U.S.C. 154(b) by 319 days.

(21) Appl. No.: 12/686,650

(22) Filed: Jan. 13, 2010

(65) Prior Publication Data

US 2010/0180635 A1 Jul. 22, 2010

(30) Foreign Application Priority Data

Jan. 20, 2009 (JP) ................. 2009-009662

(51) Int. Cl.
*C03B 11/00* (2006.01)
*C03B 9/48* (2006.01)
*C23C 14/14* (2006.01)

(52) U.S. Cl. ......... 65/66; 65/374.12; 65/305; 204/192.1

(58) Field of Classification Search ............... 65/374.12, 65/66
See application file for complete search history.

(56) References Cited

U.S. PATENT DOCUMENTS

| 5,662,999 A | 9/1997 | Taniguchi et al. |
| 5,876,478 A * | 3/1999 | Imamura et al. ............ 65/374.11 |
| 2004/0129024 A1* | 7/2004 | Stoehr et al. ...................... 65/24 |
| 2006/0130522 A1* | 6/2006 | Fukumoto et al. ................. 65/24 |

FOREIGN PATENT DOCUMENTS

| JP | 04-260619 | 9/1992 |
| JP | 2000-327344 | 11/2000 |

OTHER PUBLICATIONS

Cosset et al. "Deposition of corrosion-resistant chromium and nitrogen-doped chromium coatings by cathodic magnetron sputtering." Surface and Coatings Technology 79 (1996) 25-34.*
Zhao et al. "In situ x-ray diffraction observation of multiple texture turnovers in sputtered Cr films." Journal of Vacuum Science and Technology A 22(6) (2004) 2365-2372.*

* cited by examiner

*Primary Examiner* — Jason L Lazorcik
*Assistant Examiner* — Erin Snelting
(74) *Attorney, Agent, or Firm* — Brinks Hofer Gilson & Lione

(57) ABSTRACT

This invention provides a molding die in which increase of the surface roughness due to crystal growth of chromium oxide is restrained, and thereby allowing long term use without deteriorating surface roughness of a glass gob or a molded glass article. The invention also provides a method for manufacturing the molding die, a glass gob, and a molded glass article. A molding die is provided with a substrate having a molding surface and protective film containing chromium formed thereon, and the protective film has the X-ray diffraction peak intensity of (110) plane of chromium higher than the X-ray diffraction peak intensity of (200) plane.

7 Claims, 12 Drawing Sheets

S101

S102

S103

MOLDING DIE, METHOD FOR MANUFACTURING THE SAME AND METHOD FOR MANUFACTURING GLASS GOB AND MOLDED GLASS ARTICLE

This application is based on Japanese Patent Application No. 2009-009662 filed on Jan. 20, 2009, in Japanese Patent Office, the entire content of which is hereby incorporated by reference.

TECHNICAL FIELD

The present invention relates to a molding die for manufacturing a glass gob or a molded glass article, a manufacturing method of the molding die, and a method for manufacturing a glass gob and a molded glass article utilizing the molding die.

BACKGROUND

In recent years, an optical element made of glass is utilized in a wide range of applications such as a lens for a digital camera, an optical pickup lens for a DVD, a camera lens for a cell phone and a coupling lens for optical communication. As such an optical element made of glass, a molded glass article manufactured by pressure molding of a glass material by use of a molding die is widely utilized.

As one of such methods for manufacturing a molded glass article, known is a method in which a glass preform having a predetermined mass and form is prepared in advance and the glass preform is heated together with a molding die to be subjected to pressure molding (hereinafter, also referred to as "reheat press method"). In recent years, to reduce the manufacturing cost of a glass preform, study of a method, in which a molten glass droplet dropped from a dropping nozzle is received by a molding die and then cooled as it is to prepare a glass gob (a glass block), which is utilized as a glass preform, is in progress.

On the other hand, as another method for manufacturing a molded glass article, proposed is a method in which a dropped molten glass droplet is received by a lower mold and the glass droplet received is subjected to pressure molding by a lower mold and an upper mold to be a molded glass article (hereinafter, also referred to as "liquid droplet molding method"). This method is noticed because repeated heating and cooling of molding dies (a lower mold and an upper mold) is not required and a molded glass article is efficiently manufactured from a molten glass droplet.

As a molding die for manufacturing a glass gob or a molded glass article by such a method, known is a molding die in which a protective film containing chromium, which shows an excellent releasing property for glass, is formed on the surface of a mother material made of various ceramics or a super hard alloy (Japanese Laid-Open Patent application Publication No. H04-260619). Further, proposed is a method, in which oxygen is ion-injected into a protective film containing chromium and a heating treatment is provided in an atmosphere containing oxygen, to improve durability of the protective film (Japanese Laid-Open Patent application Publication No. 2000-327344).

In protective film containing chromium, chromium is oxidized by heating to form a layer of chromium oxide on the surface. Chromium oxide has very low standard free energy of formation (standard Gibbs' energy of formation) and is very stable to show low reactivity with glass, resulting in an excellent releasing property.

However, there was a problem that, when oxidation of protective film proceeds with long term use, the roughness of the surface is increased due to crystal growth of chromium oxide, and the surface roughness of a glass gob or a molded glass article having been manufactured may thus be increased. A method described in Japanese Laid-Open Patent application Publication No. 2000-327344 not only requires an ion-injection process which is complex and expensive but also shows an insufficient effect to restrain crystal growth of chromium oxide.

SUMMARY

This invention has been made in view of the above-described technical problems, and an object of the invention is to provide a molding die which can restrain increase in surface roughness due to crystal growth of chromium oxide and allows long term use without deteriorating the surface roughness of a glass gob or a molded glass article, a manufacturing method of the molding die, and a method for manufacturing a glass gob and a molded glass article utilizing the molding die.

In view of forgoing, one embodiment according to one aspect of the present invention is a molding die for manufacturing a glass gob or a molded glass article, the molding die comprising:

a substrate having a molding surface;

a protection film containing chromium formed on the molding surface, in which protection film, an X-ray diffraction peak intensity of (110) plane of chromium is higher than an X-ray diffraction peak intensity of (200) plane of chromium.

According to another aspect of the present invention, another embodiment is a method for manufacturing a molding die for manufacturing a glass gob or a molded glass article, the method comprising the step of:

forming a protection film containing chromium on a molding surface of a substrate, in which protection, film an X-ray diffraction peak intensity of (110) plane of chromium is higher than an X-ray diffraction peak intensity of (200) plane of chromium.

According to another aspect of the present invention, another embodiment is a method for manufacturing a glass gob, the method comprising the steps of:

dropping a droplet of molten glass onto the above-mentioned molding die; and cooling and solidifying the dropped droplet of molten glass on the molding die.

According to another aspect of the present invention, another embodiment is a method for manufacturing a molded glass article, the method comprising the steps of:

dropping a droplet of molten glass on a first molding die; and press-molding the dropped droplet of molten glass with the first molding die and a second molding die, wherein at least one of the first molding die and the second molding die is the above-mentioned molding die.

DETAILED DESCRIPTION OF THE PREFERRED EMBODIMENT

In the following, an embodiment of the invention will be detailed referring to FIGS. 1-12; however, this invention is not limited to the embodiment.

Figure 1:
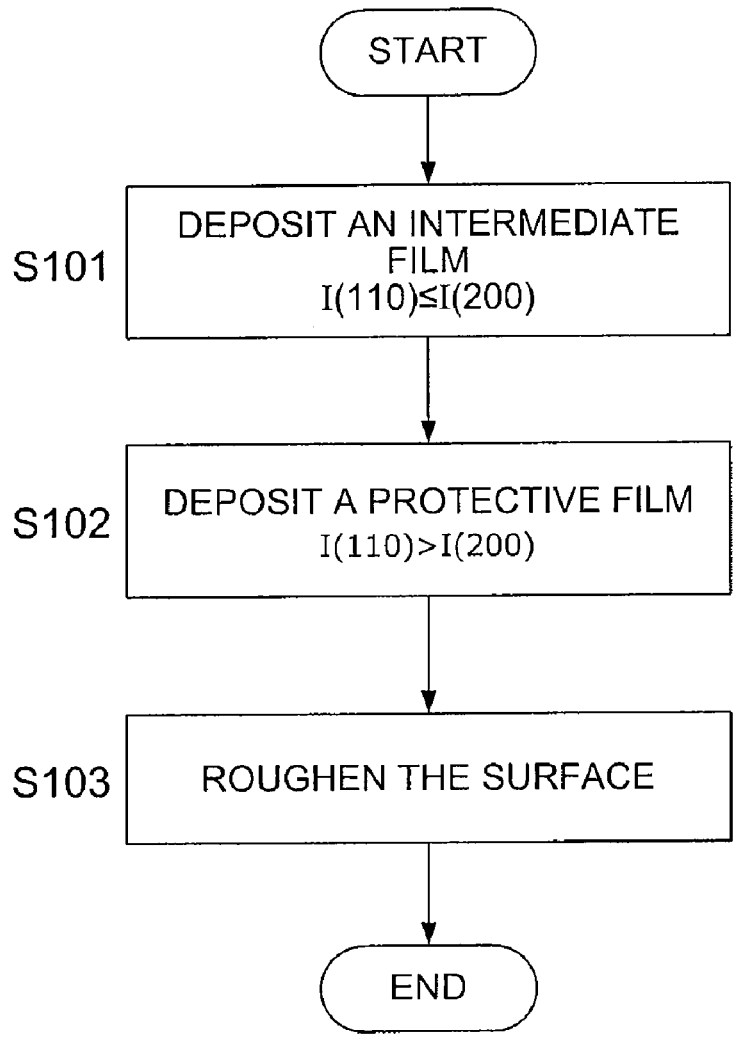
FIG. 1 is a flow chart to show an example of a method for manufacturing a molding die.

First, a molding die and a manufacturing method thereof will be described referring to FIGS. 1-6. FIG. 1 is a flow chart to show a method for manufacturing a molding die in this embodiment, and FIGS. 2a, 2b, 2c and 2d are sectional views to schematically show the state of a molding die in each step.

(Substrate)

Figure 2A:
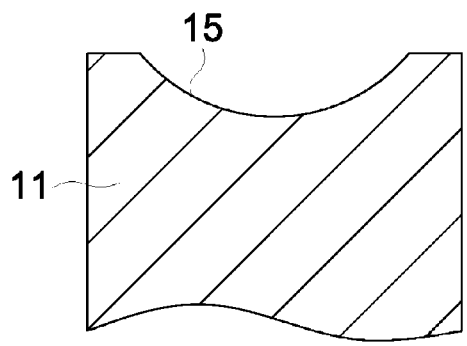
FIGS. 2a, 2b, 2c and 2d are cross-sectional views to schematically show the state of the molding die in each step.

Substrate 11 of molding die 10 is processed to have molding surface 15 having a predetermined form corresponding to a molded glass article to be manufactured, in advance (FIG. 2a). A material of substrate 11 is not specifically limited. Materials to be preferably utilized include, for example, various heat resistant alloys (such as stainless), super hard materials containing tungsten carbide as a primary component, various ceramics (such as silicon carbide and silicone nitride) and complex materials containing carbon. Further, materials also to be utilized may be these materials a surface of which is provided with a compact processed layer such as CVD silicon carbide film.

(Deposition of Intermediate Film)

Figure 2B:
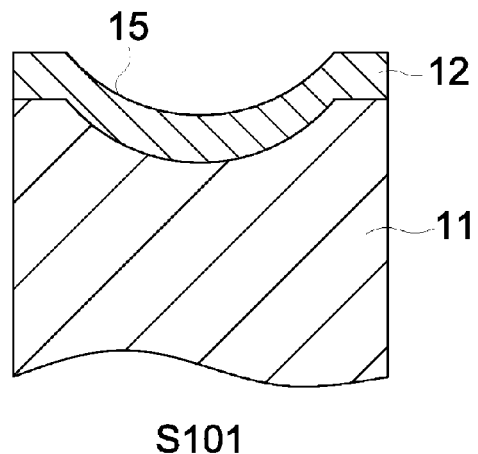

Next, intermediate film 12 is deposited on molding surface 15 (step S101, FIG. 2b). This step is not necessarily an indispensable step; however, adhesion of protective film can be improved and there is an effect to further improve durability of molding die 10, by provided intermediate film 12 between substrate 11 and protective film 13. A material for intermediate film 12 is not specifically limited; however, materials containing chromium are preferable in view of improving adhesion of protective film 13. Particularly, it is preferable that the X-ray diffraction peak intensity of (110) plane of chromium is equal to or lower than the X-ray diffraction peak intensity of (200) plane of chromium, because adhesion with substrate 11 is specifically strong to improve durability of molding die 10 under that condition. Herein, described later is a deposition method of film which shows the X-ray diffraction peak intensity of (110) plane of chromium not higher than the X-ray diffraction peak intensity of (200) plane chromium.

The thickness of intermediate film 12 is preferably not less than 0.05 μm and more preferably not less than 0.1 μm in view of improving adhesion of substrate 11 and protective film 13. To the contrary, if the thickness of intermediate film is too thick, there may be created defects such as film peeling; therefore, the thickness is preferably not more than 5 μm and more preferably not more than 1 μm.

(Deposition of Protective Film)

Figure 2C:
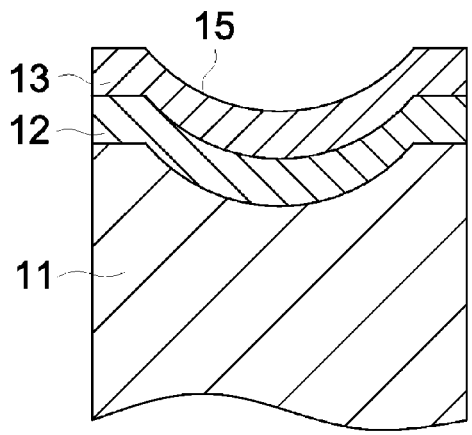

Next, protective film 13 is deposited on molding surface 15 (Step S102, FIG. 2c). Protective film 13 contains chromium and is deposited so as to make the X-ray diffraction peak intensity of (110) plane of chromium higher than the X-ray diffraction peak intensity of (200) plane of chromium.

Conventionally, chromium film utilized as protective film of a molding die has been deposited under a condition to make adhesion with a substrate as strong as possible. For example, in the case of deposition by sputtering method, it is possible to improve adhesion with a substrate by selecting a deposition condition so as to make sputtered particles have large energy when reaching the deposition surface. However, in chromium film deposited under such a condition, there was a problem that the crystalline particle of chromium oxide is apt to grow larger, when a chromium oxide is created, by heating, to form a chromium oxide layer on the surface, resulting in deterioration of the surface roughness in a short time.

The inventors of the invention have studied extensively to solve such a problem and found that it is possible to restrain deterioration of surface roughness due to excessive growth of crystal grains of chromium oxide by depositing chromium film under a condition different from a conventional one. And as a result of further study, it has been proved that growth of crystal grains of chromium oxide can be restrained in the case of X-ray diffraction intensity of (110) plane of chromium being higher than diffraction intensity of (200) plane of chromium.

Figure 3:
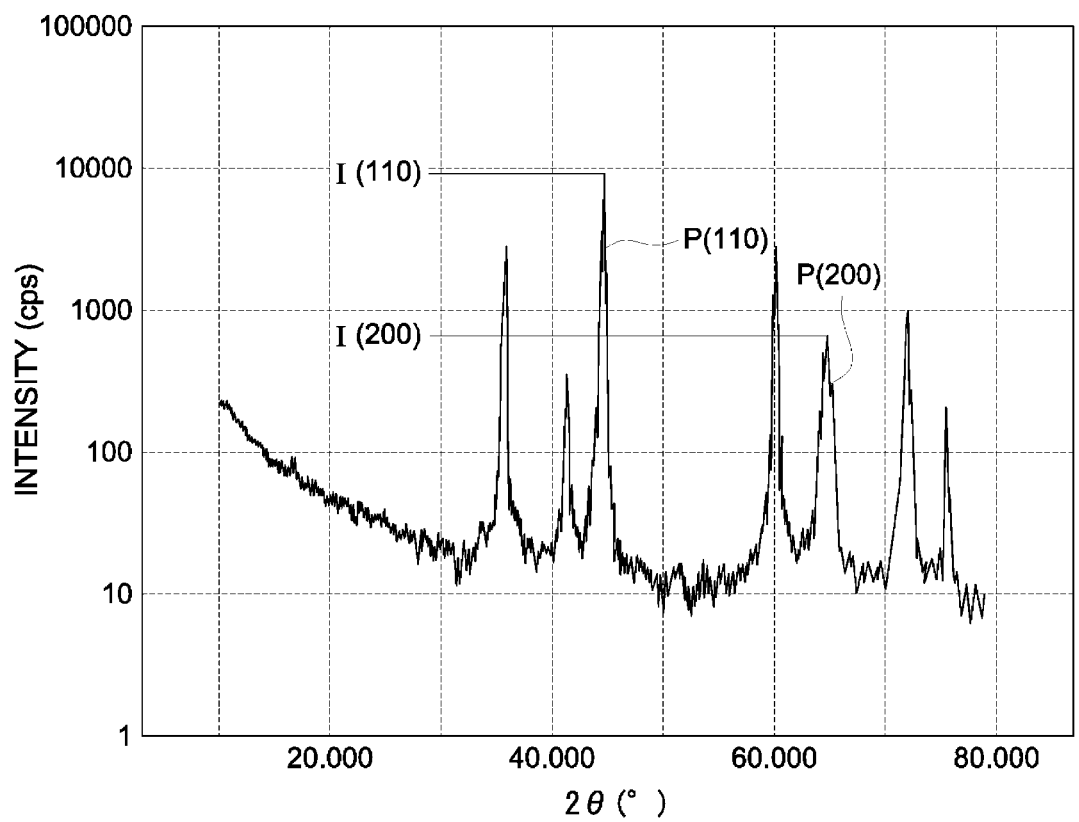
FIG. 3 is a drawing to show an example of an X-ray diffraction pattern of protective film according to the embodiment.
Figure 4A:
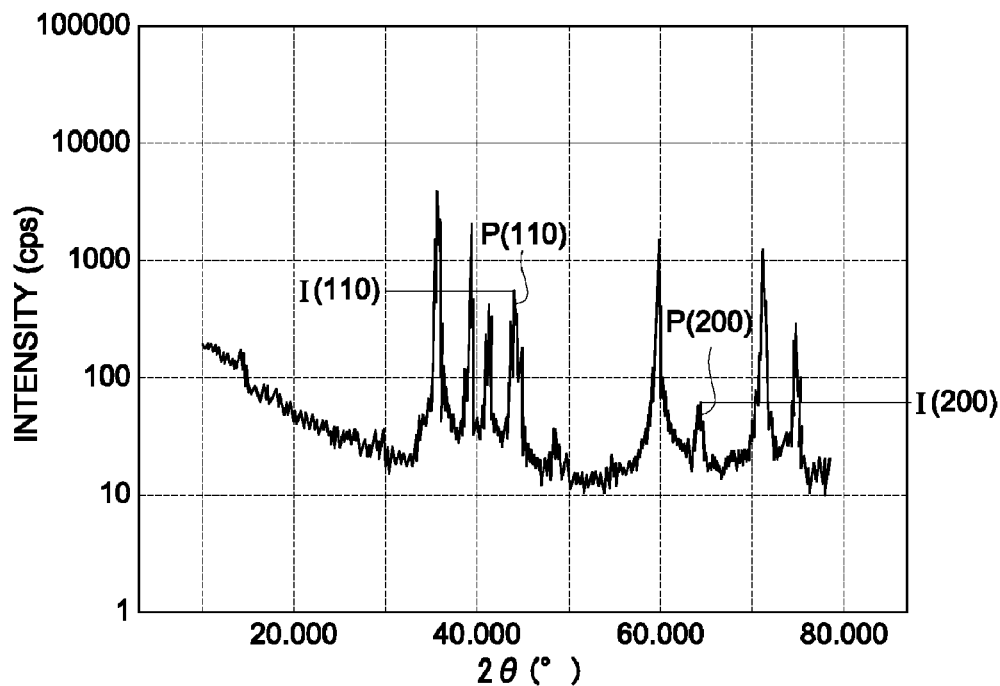
FIGS. 4a and 4b are drawings to show another example of an X-ray diffraction pattern of protective film according to the embodiment.
Figure 4B:
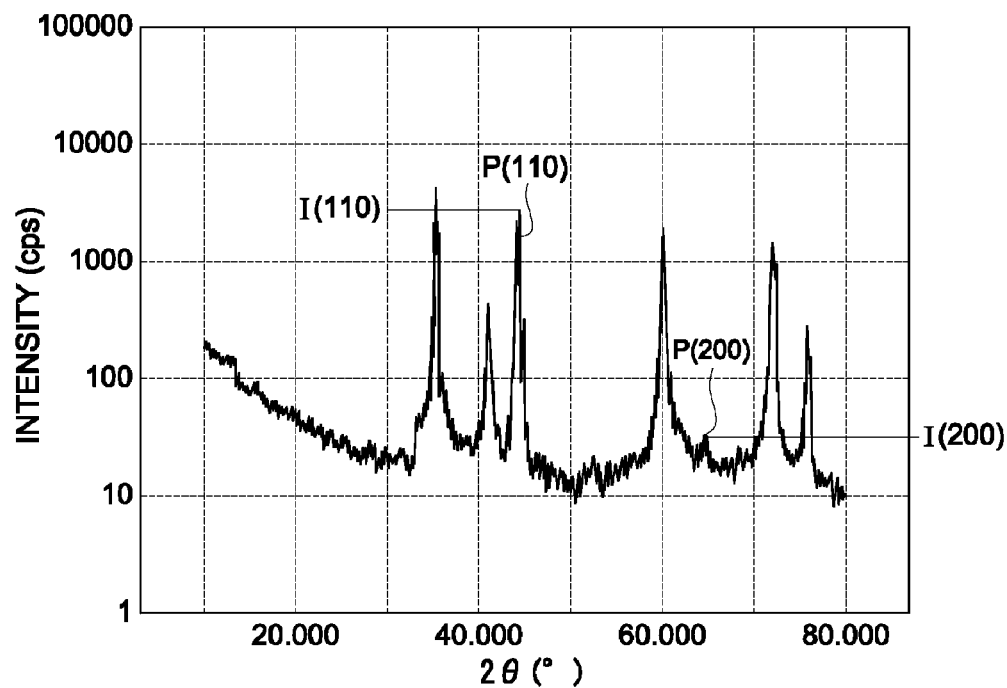
Figure 5:
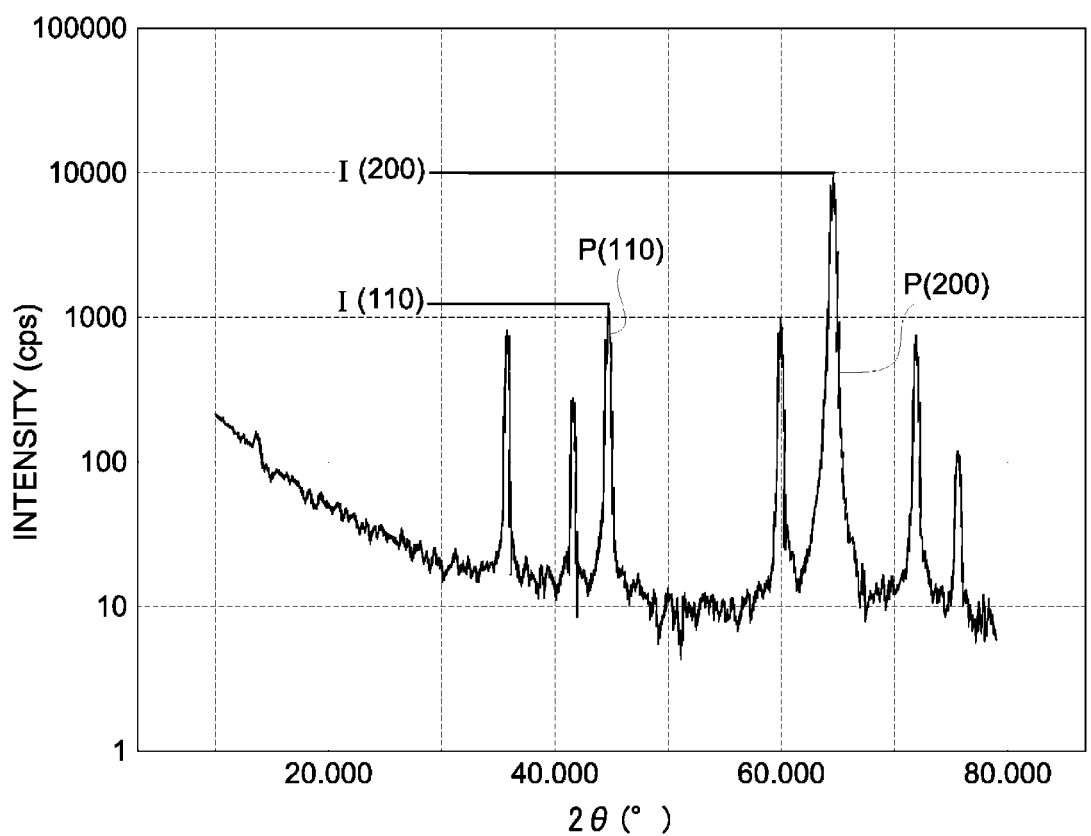
FIG. 5 is a drawing to show an example of an X-ray diffraction pattern of intermediate film according to the embodiment.

Examples of an X-ray diffraction pattern of protective film 13 (chromium film) in this embodiment are shown in FIGS. 3, 4a and 4b, and that of intermediate film 12 (chromium film) in this embodiment is shown in FIG. 5, respectively. The X-ray diffraction pattern of chromium film utilized as a protective film of a conventional molding die is similar to the X-ray diffraction pattern of intermediate film 12 in this embodiment which is shown in FIG. 5. Any one of FIGS. 3-5 has been measured by use of X-ray diffractometer RINT2500 manufactured by Rigaku Co., Ltd. under conditions of a range of 0-80°, a sampling width of 0.02° and a scanning speed of 5/min according to a θ-2θ method. The lateral axis of the graph shows the angle (2θ) of a diffraction line and the vertical axis shows the intensity. The intensity is represented by a count number per one second (cps). Herein, peaks other than those arising from chromium are due to silicon carbide utilized as a substrate. The form of a substrate is a plane.

Herein, measurement of an X-ray diffraction pattern may not be easy depending on the size of molding die 10 or the form of molding surface 15. In such a case, control of chromium film deposited on molding die 10 may be performed by preparing a substrate for measurement of an X-ray diffraction pattern separately on which chromium film is also deposited simultaneously with the deposition on molding die 10. Any shape and material are acceptable for a substrate for measurement as long as an X-ray pattern is easily measured, and a planar substrate of the same material as substrate 11 is preferable.

Diffraction peak P (110) of (110) plane of chromium appears in the neighborhood of 2θ=44°, and diffraction peak P (200) of (200) plane of chromium appears in the neighborhood of 2θ=64°. In the case of conventional chromium film shown in FIG. 5, the intensity I(100) of diffraction peak P (110) of the (110) plane is lower than intensity I(200) of the diffraction peak P (200) of the (200) plane. Thereby, the surface roughness is apt to be deteriorated due to large growth of crystal grain of chromium oxide. On the other hand, in the case of protective film 13 of this embodiment shown in FIG. 3, the intensity I(110) is higher than I(200). Thereby, deterioration of the surface roughness due to crystal growth of chromium oxide can be effectively restrained.

To achieve an advantage of restraining deterioration of the surface roughness, I(110) should be higher than I(200) although the ratio thereof is not limited. For example, possible is patterns such as shown in FIGS. 4a and 4b in which the ratio of I(200) to I(110) is lower. Further, such a pattern in which I(200) is further lower and the diffraction peak (200) cannot be recognized is acceptable.

Herein, a material of protective film 13 is preferably chromium (metal chromium); however, it may contain materials other than chromium as far as their amount does not disturb the effect of this invention. Further, a layer of chromium oxide is formed on the surface of protective film 13 due to heating when being used.

The thickness of protective film 13 is preferably not less than 0.05 μm and more preferably not less than 0.1 μm, in view of preventing progress of oxidation from reaching intermediate film 12 or substrate 11. On the other hand, since defects such as film peeling may be easily generated when protective film 13 is excessively thick, it is preferably not more than 5 μm and more preferably not more than 1 μm.

Next, a method for depositing intermediate film 12 and protective film 13 will be explained. The deposition method of intermediate film 12 and protective film 13 is not limited. Preferably utilized methods include a vacuum evaporation method, a sputtering method, a DVD method. Among them, a sputtering method is specifically preferable because it is easy to continuously form intermediate film 12, in which I(110) is lower than I(200), and protective film 13, in which I(110) is higher than I(200), by changing the deposition condition. In the following, a sputtering method will be explained as an example.

Figure 6:
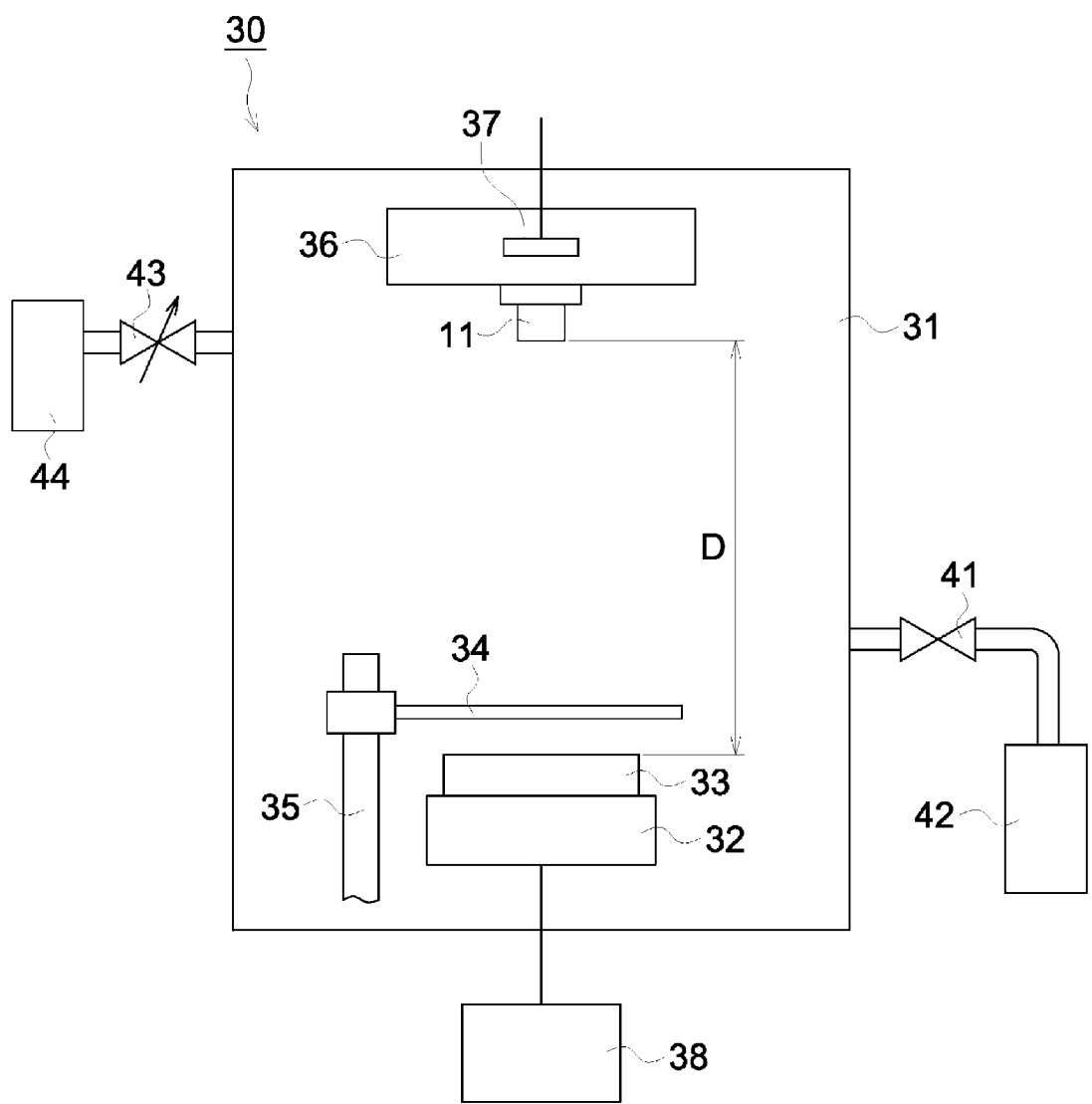
FIG. 6 is a schematic drawing to show an example of a sputtering system utilized in the embodiment.

FIG. 6 is a drawing to show an example of a sputtering system used in this embodiment and shows sputtering system 30 of a parallel plate type. Substrate 11 is held by substrate holder 36, which is arranged at the upper portion of vacuum chamber 31, with the deposition surface facing downward. Further, target 33 (chromium target) which is a material of intermediate film 12 and protective film 13 is attached on sputtering electrode 32 connected to power source 38, and the inside of vacuum chamber 31 is evacuated to a predetermined degree of vacuum by evacuation pump 42 connected to vacuum chamber 31 via valve 41. At this time, substrate 11 is heated at a predetermined temperature by heater 37 arranged on substrate holder 36. After the inside of vacuum chamber 31 is evacuated to a predetermined degree of vacuum, a sputtering gas is introduced from gas container 44 via flow rate control valve 43 to set the inside of vacuum chamber 31 at a predetermined pressure, and plasma is generated in the neighborhood of the upper surface of target 33 by application of a predetermined voltage to sputtering electrode 32 by power source 38. Thereby, ions of a sputtering gas are made to collide against target 33 and the constituent element (chromium) is made to burst out as sputtered particles. And, when shutter 34 is removed from the upper portion of target 34 by rotation of rotation shaft 35, sputtered particles having been burst out by collision of ions reach and accumulate on substrate 11 located at the upper position, whereby chromium film is formed on the deposition surface.

The inventors of this invention have found that the ratio of intensity I(110) of diffraction peak P (110) of (110) plane of formed chromium film to intensity I(200) of diffraction peak P (200) of (200) plane varies depending on the magnitude of the energy of sputtered particles when reaching the deposition surface. That is to say, if the energy of the sputtered particles is small when reaching the deposition surface, I(110) is higher than I(200), and if the energy of the sputtered particles is large when reaching the deposition surface I(110) is lower than I(200). Therefore, by firstly performing deposition under a condition of higher energy of the sputtered particles arriving at the deposition surface and then the deposition condition is changed to perform deposition under a condition of lower energy of the sputtered particles, it is possible to deposit intermediate film 12 in which I(110) is lower than I(200) and protective film 13 in which I(110) is higher than I(200).

Deposition conditions which influence the energy of the sputtered particles arriving at the deposition surface include temperature of substrate 11, the pressure of a sputtering gas, the distance between target 33 and the deposition surface, and the electric power applied to sputtering electrode 32, during deposition.

Since the mean free pass of sputtered particles is shorter when the pressure of a sputtering gas is higher, the greater number of mean collision number occur until the sputtered particles reach the deposition surface. Thus, the energy of the sputtered particles arriving at the deposition surface will be decreased. Thereby, I(110) is higher than (200) in the formed chromium film. On the other hand, the energy of the sputtered particles arriving at the deposition surface increases when the pressure of a sputtering gas decreases, whereby I(110) is lower than I(200) in the formed chromium film will have.

Further, since the mean number of collision between sputtered particles and sputtering gas particles is higher when distance between target 33 and the deposition surface (D in FIG. 6) is longer, and thus, the energy of the sputtered particles arriving at the deposition surface will be decreased. Thereby, I(110) is higher than (200) in the formed chromium film. On the other hand, the energy of the sputtered particles arriving at the deposition surface is higher when distance between target 33 and the deposition surface (D) is shorter, whereby I(110) is lower than I(200) in the formed chromium film.

Further, since energy of ions colliding against target 33 will decrease when electric power applied to sputtering electrode 32 decreases, the energy of the sputtered particles being sputtered by collision will be also decreased. Thereby, I(110) is higher than (200) in the formed chromium film. On the contrary, the energy of the sputtered particles being sputtered will be increased when electric power applied to sputtering electrode 32 increases, whereby I(110) is lower than (200) in the formed chromium film.

Further, it is preferable to perform deposition of intermediate film 12 and protective film 13 continuously while continuously changing the deposition condition. Thereby, it is possible to manufacture molding die 10 having specifically strong adhesion between intermediate film 12 and protective film 13, and having excellent durability.

(Roughening of Protective Film)

It is also preferable to provide the surface of formed protective film 13 with roughening by etching. Thereby, it is possible to reduce generation of air reserves due to sealing of an environmental gas at the time of receiving a molten glass droplet having been dropped or at the time of pressure molding. Protective film 13 of this embodiment, which has I(110) higher than I(200), shows an advantage of easy formation of roughness by etching and enables easy roughening of the surface. Further, since intermediate film 12 having I(110)

lower than I(200) exhibits an effect to disturb the progress of etching, there is an advantage to prevent the influence of etching from reaching as far as substrate 11 by providing intermediate film 12.

Etching may be performed by means of either wet etching utilizing a reactive liquid or dry etching utilizing a reactive gas.

Roughening by wet etching is a method to form roughness by making a reactive liquid contact and react with protective film 13. Protective film 13 may be immersed into an etching solution reserved in a vessel or a predetermined amount of etching solution may be supplied to protective film 13. Further, a method to spray etching solution in a spray form may be also available. Roughening by means of wet etching can perform a treatment with excellent uniformity and at low cost without requiring an expensive and large scale facility. Further, to perform a stable treatment, it is preferable to maintain conditions such as ambient temperature and illuminance in a processing room; temperature of a molding die; a number of processed pieces; temperature, quantity, concentration and flow of the liquid of etching solution, to be constant. On the contrary, by changing these conditions, it is possible to appropriately control the depth and cycle of roughness to be formed.

The etching solution is not specifically limited and various acidic solutions and alkaline solutions can be utilized. Among them, an acidic solution containing ammonium ceric nitrate and an alkaline solution containing potassium ferricyanate and potassium hydroxide can be specifically preferably utilized because either of them can roughen the surface of protective film 13 more uniformly in a short period.

Roughening by means of dry etching is a method in which an etching gas is introduced into a vacuum chamber and plasma is generated by high frequency waves, whereby protective film 13 is roughened by ions and/or radicals generated by the plasma. It is also referred to as plasma etching or reactive ion etching (RIE). It is a preferable method because it gives a small environmental load with no waste liquid generated, the surface is contaminated with few foreign matters, and the reproducibility of process is excellent. An apparatus utilized for dry etching may be selected among apparatuses well known in the art such as a parallel plate type, a barrel (cylinder) type, a magnetron type and an ECR type and is not specifically limited. An etching gas may be either an inert gas such as Ar or a highly reactive gas containing halogen such as F, Cl and Br.

Herein, in either method of wet etching or dry etching, the whole surface of protective film 13 is not necessarily roughened, however, at least the region which contact with a molten glass droplet should be roughened. It is also preferable to utilize a mask to limit the region to be etched so as to process only a desired region while preventing deterioration of substrate 11 by etching.

The surface of protective film 13 after etching is preferably provided with an arithmetic mean roughness (Ra) of not less than 0.005 µm and a mean length of a roughness curve element (RSm) of not more than 0.5 µm. Thereby, it is possible to effectively restrain generation of air reserves on a glass gob or a molded glass article. Further, with respect to restraining surface roughness of a glass gob and a molded glass article, the arithmetic mean roughness (Ra) is preferably not more than 0.05 µm and more preferably not more than 0.03 µm. Herein, the arithmetic mean roughness (Ra) and the mean length of a roughness curve element (RSm) are roughness parameters which are defined in JIS B 0601:2001. The measurement of these parameters is performed by use of a measurement device having a spatial resolution of not more than 0.1 µm such as AFM (Atomic Force Microscope).

(Method for Manufacturing Glass Gob)

Figure 7:
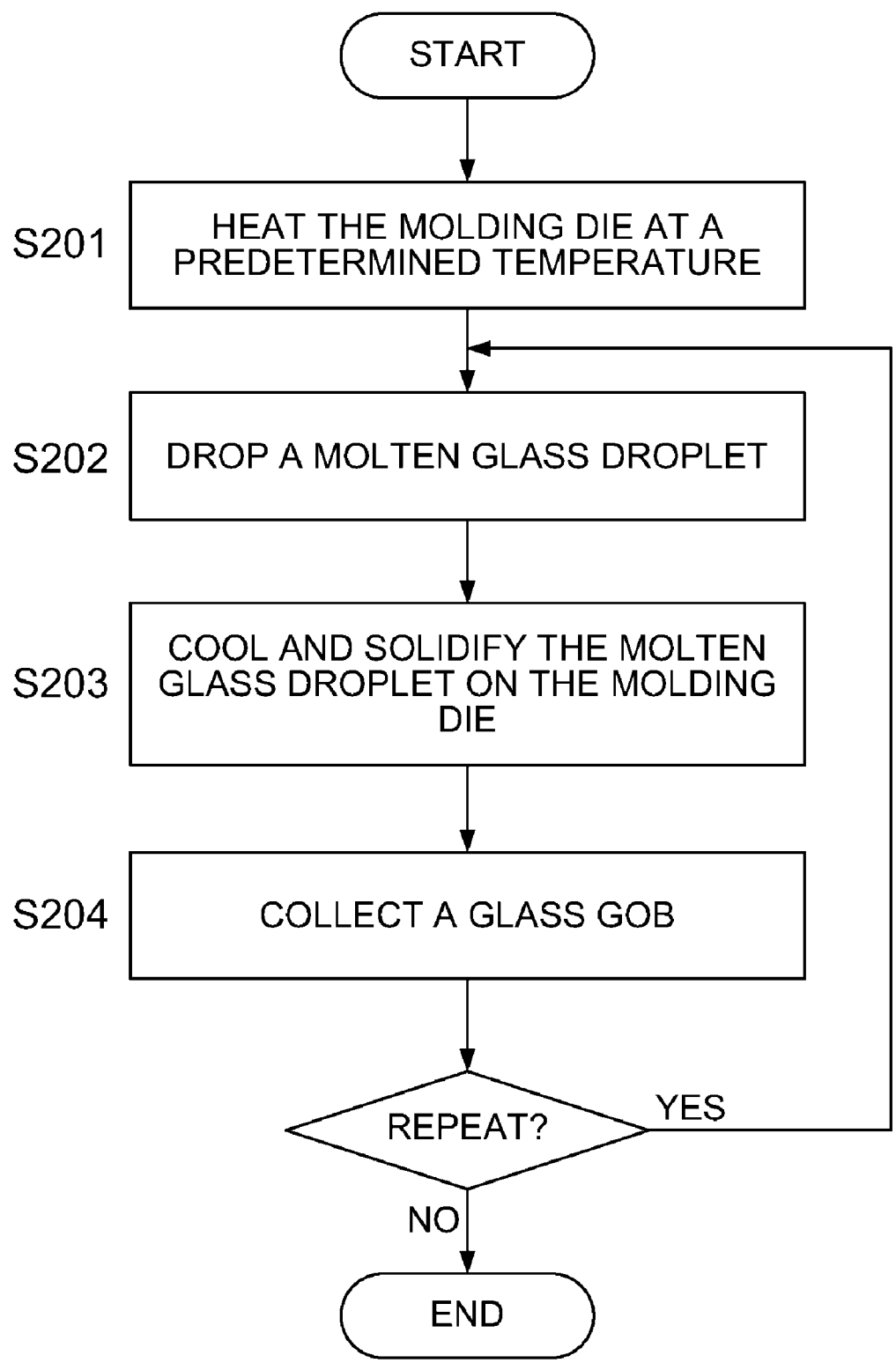
FIG. 7 is a flow chart to show an example of a method for manufacturing a glass gob.
Figure 8:
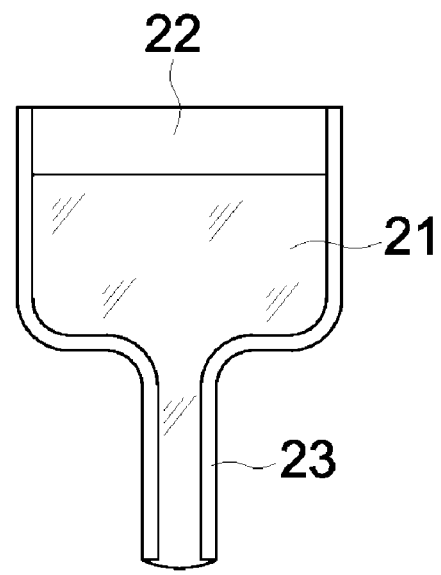
FIG. 8 is a schematic drawing to show a manufacturing apparatus of a glass gob (the state in Step S202)
Figure 8:
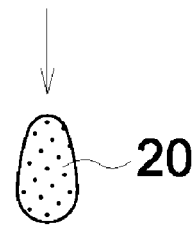
Figure 8:
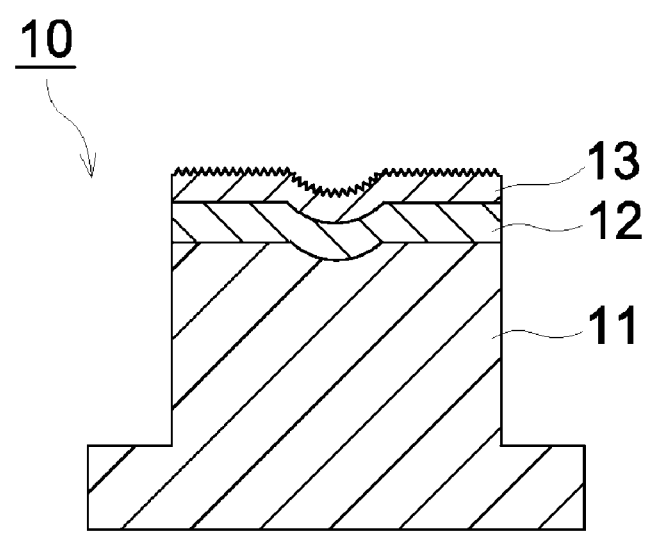
Figure 9:
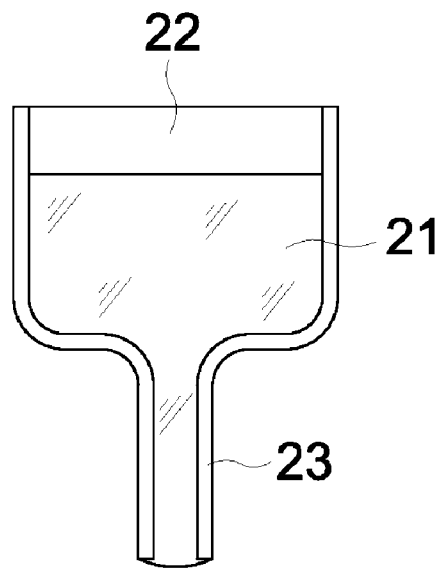
FIG. 9 is a schematic drawing to show a manufacturing apparatus of a glass gob (the state in Step S203)
Figure 9:
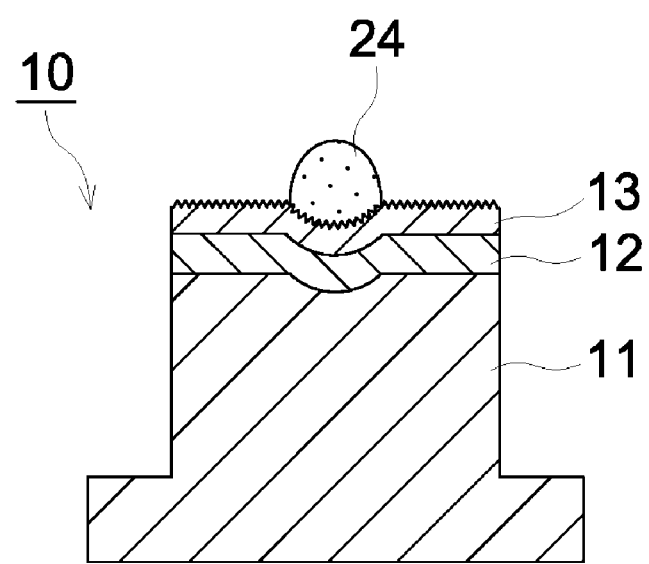

Next, method for manufacturing a glass gob, which is an example of this embodiment, will be explained in reference to FIGS. 7-9. FIG. 7 is a flow chart to show an example of a method for manufacturing a glass gob, and FIGS. 8 and 9 are schematic drawings to show a manufacturing apparatus of a glass gob which is utilized in this embodiment. FIG. 8 shows the state in the step (S202) to drop a molten glass droplet into a molding die, and FIG. 9 shows the state in the step (S203) to cool and solidify the molten glass droplet on the molding die, respectively.

The apparatus for manufacturing a glass gob shown in FIGS. 8 and 9 is provided with melting basin 22 to store molten glass 21, dropping nozzle 23 which is connected to the lower portion of melting basin 22 to drop molten glass droplet 20, and molding die 10 to receive molten glass droplet 20 being dropped. Molding die 10 is provided with, substrate 11 having a molding surface, and intermediate film 12 and protective film 13 formed on the molding surface, and the surface of protective film 13 is roughened. Herein, as described above, intermediate film 12 is not necessarily required, and the surface of protective film 13 may be utilized without being subjected to roughening.

Molding die 10 is constituted so as to be heated at a predetermined temperature by a heating means which is not shown in the drawing. A heating means well known in the art can be selected to be used, for example, a cartridge heater which is utilized being buried inside molding die 10, a sheet form heater utilized in contact with the outside of molding die 10, an infrared heater or a high frequency induction heater.

In the following, each step of a method for manufacturing a glass gob will be explained in order, according to the flow chart shown in FIG. 7.

First, molding die 10 is heated at a predetermined temperature in advance (Step S201). Wrinkles are apt to be generated on the under surface (the surface contacting with molding die 10) of a glass gob when the temperature of molding die 10 is too low, and cracks and minute cracks may be generated due to rapid cooling. On the other hand, fusing of glass with molding die 10 is easily caused when the temperature is unnecessarily raised, and thereby shortening the life of a molding die. Practically, since the appropriate temperature differs depending on various conditions such as the type, form and size of glass, and the material and size of molding die 10; it is preferable to determine an appropriate temperature experimentally in advance. Generally, the temperature is preferably set to between Tg −100° C. and Tg +100° C., when the glass transition temperature of utilized glass is supposed Tg.

Next, molten glass droplet 20 is dropped from dropping nozzle 23 (Step S202) (refer to FIG. 8). Dropping of molten glass droplet 20 is performed by heating dropping nozzle 23, which is connected to melting basin 22 which stores molten glass 21 at a predetermined temperature. Molten glass 21 is supplied to the top portion of dropping nozzle 23 by its own weight and stays in a liquid drop form due to the surface tension when dropping nozzle 23 is heated at a predetermined temperature. Molten glass droplet staying at the top portion of dropping nozzle 23, when it reaches a certain mass, is naturally separated from dropping nozzle 23 and falls downward as molten glass droplet 20.

The mass of molten glass droplet 20 dropped from dropping nozzle 23 can be controlled by the outer diameter of the top portion of dropping nozzle 23, and molten glass droplet 20 of approximately 0.1-2 g can be dropped although it depends on a kind of glass and such. Further, molten glass droplets, which have been micronized by once making molten glass droplet 20 dropped from dropping nozzle 23 collide with a member having micro through-holes so as to make a part of the collided molten glass droplet pass through the micro through-holes, may be supplied to molding die 10. By adopting such a method, since a micro glass droplet of, for example, as little as 0.001 g can be obtained, it is possible to manufacture a glass gob more minute than one prepared by direct receiving molten glass droplet 20 dropped from dropping nozzle 23 on molding die 10. Herein, the interval of dropping of molten glass droplets 20 from dropping nozzle 23 can be finely controlled by the inner diameter, length and heating temperature, of dropping nozzle 23 and so on.

The available kind of glass is not specifically limited, and glass well known in the art can be selectively utilized by depending on applications. For example, examples include optical glass such as boric silicate glass, silicate glass, phosphate glass and lanthanum type glass.

Next, molten glass droplet 20 having been dropped is cooled and solidified (Step S203) on molding die 10 (refer to FIG. 9). Molten glass droplet 20 is cooled and solidified due to heat release toward molding die 10 or toward the ambient air while being kept on molding die 10 for a predetermined time. Thereafter, glass gob 24 having been solidified is collected (Step S204) to complete manufacture of glass gob 24. Collection of glass gob 24 can be performed by use of a collecting device well known in the art utilizing vacuum suction. In order to succeedingly manufacture another glass gob 24, processes starting from Step S202 are repeated.

Repetitive manufacture of glass gob 24 in this manner causes the surface of molding die 10 to be gradually oxidized, and a layer of chromium oxide is thereby formed. However, because the molding surface of molding die 10 of this embodiment is provided with protective film 13 having I(110) higher than I(200), increase of the surface roughness due to crystal growth of chromium oxide is restrained, and thereby allowing long term use of molding die 10 without deteriorating the surface roughness of glass gob 24.

It should be noted that glass gob 24 manufactured by the manufacturing method of this embodiment can be used as a glass preform for manufacturing various optical elements by means of the reheat press method.

(Method for Manufacturing Molded Glass Article)

Figure 10:
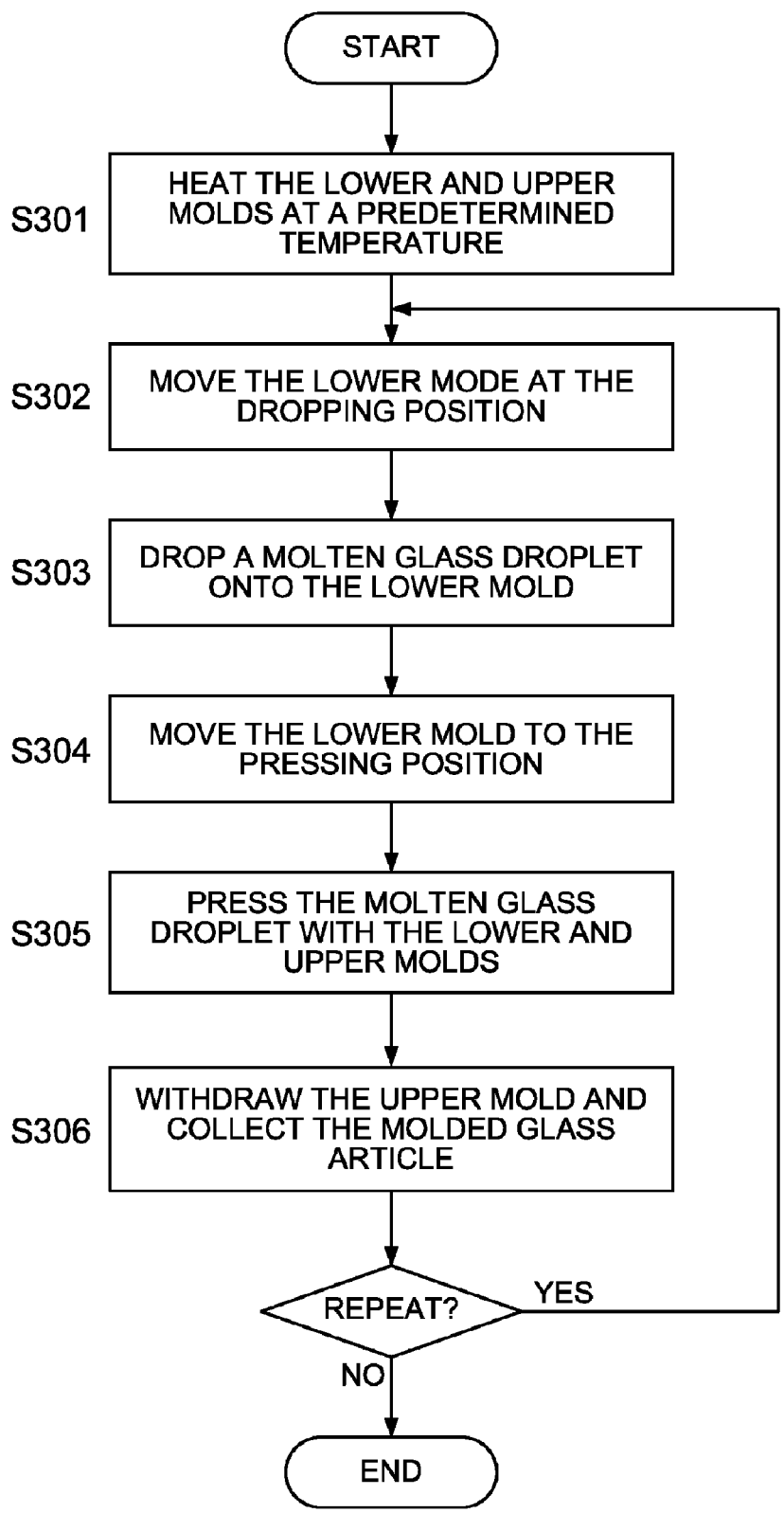
FIG. 10 is a flow chart to show an example of a method for manufacturing a molded glass article.
Figure 11:
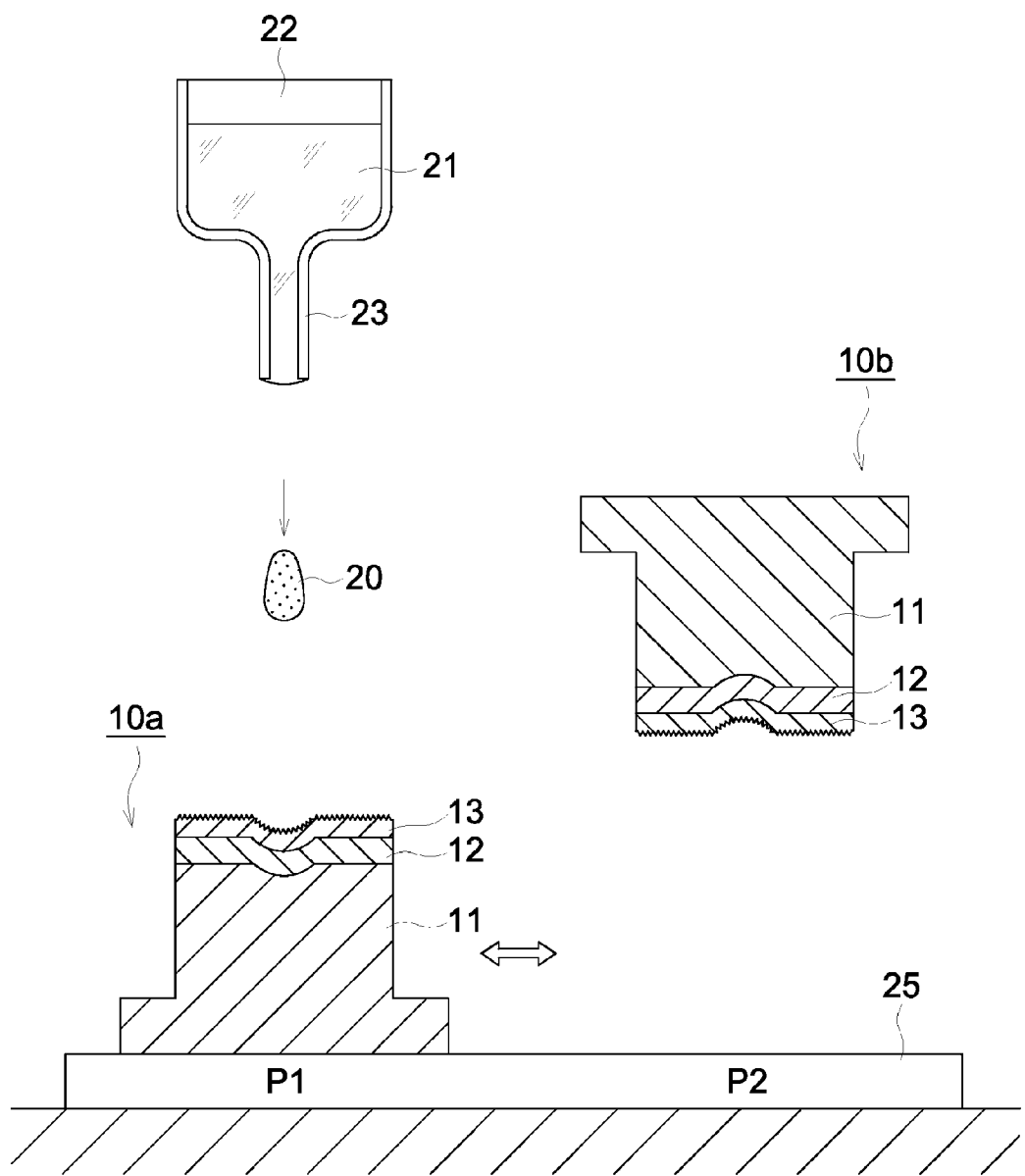
FIG. 11 is a schematic drawing to show a manufacturing apparatus of a molded glass article (the state in Step S303)
Figure 12:
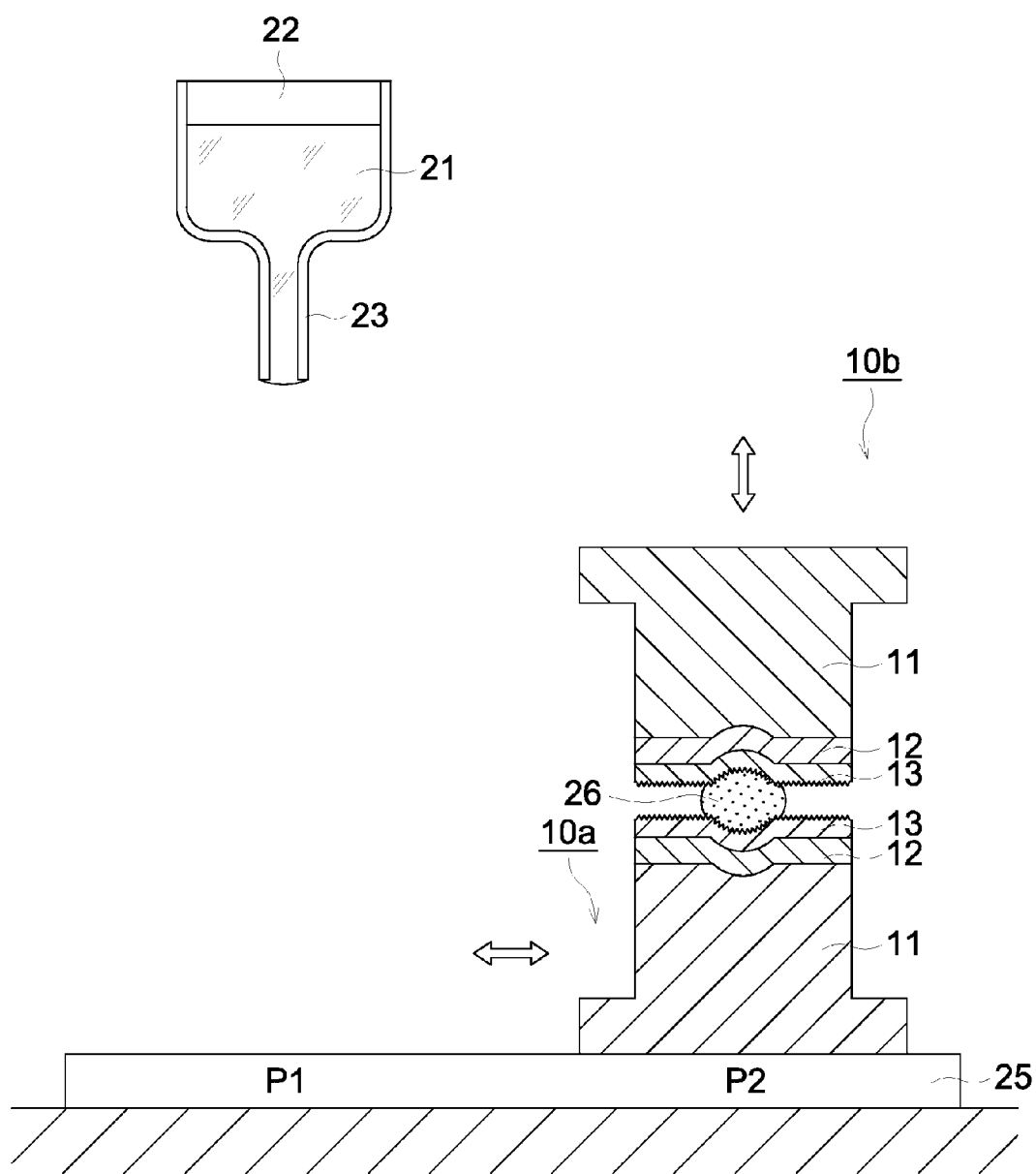
FIG. 12 is a schematic drawing to show a manufacturing apparatus of a molded glass article (the state in Step S305).

Next, a method for manufacturing a molded glass article, which is another example of this embodiment, will be explained in reference to FIGS. 10-12. FIG. 10 is a flow chart to show an example of a method for manufacturing a molded glass article. Further, FIGS. 11 and 12 are schematic drawings of an apparatus for manufacturing a molded glass article, which is utilized in this embodiment. FIG. 11 shows the state in the step (S303) to drop a molten glass droplet into a lower mold, and FIG. 12 shows the state in the step (S305) to compress the molten glass droplet having been dropped with a lower mold and an upper mold.

The apparatus for manufacturing a molded glass article shown in FIGS. 11 and 12 is provided with melting basin 22 to store molten glass 21, dropping nozzle 23 which is connected to the lower portion of melting basin 22 and drops molten glass droplet 20, lower mold 10a (the first molding die) for receiving molten glass droplet 20 being dropped, and upper mold 10b (the second molding die) for performing pressure molding of molten glass droplet 20 together with lower mold 10a. Lower mold 10a and upper mold 10b each are provided with substrate 11 having a molding surface, and intermediate film 12 and protective film 13 formed on the molding surface; and the surface of protective film 13 has been subjected to roughening. It should be noted that intermediate film 12 is not necessarily required, and the surface of protective film 12 may be utilized as it is formed without subjecting to roughening. Further, in FIGS. 11 and 12, both of lower mold 10a and upper mold 10b are provided with protective film 13; however, the embodiment is not limited thereto and at least one of lower mold 10a and upper mold 10b may be provided with protective film 13 having I(110) higher than I(200).

Lower mold 10a and upper mold 10b are configured to be heated at a predetermined temperature by a heating means, which is not shown in the drawing. It is preferable that each of lower mold 10a and upper mold 10b is arranged to be independently temperature controlled. Lower mold 10a is configured to be movable along guide 25 between the position to receive molten glass droplet 20 (dropping position P1) and the position, opposing to upper mold 10b (compression position P2), to perform pressure molding. Further, upper mold 10b is configured to be movable in the direction to compress molten glass droplet 20 (in the top-and-bottom direction in the drawing) by a drive means, which is not shown in the drawing.

In the following, each step of a method for manufacturing a molded glass article will be explained in order according to a flow chart shown in FIG. 10. Herein, detailed explanation of a process similar to the above-described method for manufacturing a glass gob will be omitted.

First, lower mold 10a and upper mold 10b are heated at a predetermined temperature (Step S301). As a predetermined temperature, a temperature at which a good transferred surface of a molded glass article can be formed by pressure molding is selected. The heating temperature of lower mold 10a and that of upper mold 10b may be the same or different from each other. Next, lower mold 10a is shifted to dropping position P1 (Step S302), and molten glass droplet 20 is dropped from dropping nozzle 23 (Step S303) (refer to FIG. 11). A method for dropping molten glass droplet 20 is similar to the case of Step S202 of the above-described method for manufacturing a glass gob.

Next, lower mold 10a is shifted to pressing position P2 (Step S304), and upper mold 10b is shifted downward to perform pressure molding of molten glass droplet 20 with lower mold 10a and upper mold 10b (Step S305) (refer to FIG. 12). Molten glass droplet 20 received by lower mold 10a is cooled due to heat release through the contact surface with lower mold 10a and upper mold 10b while being subjected to pressure molding and is solidified to be molded glass article 26. When molded glass article 26 is cooled to a predetermined temperature, upper mold 10b is shifted upward to release pressure. It is generally preferable to release pressure after cooling molded glass article 26 to a temperature near Tg of glass, although it depends on the kind of glass, the size and form of a molded glass article, and the precision required.

A load to be applied for pressing molten glass droplet 20 may be constant or varied by time. The magnitude of load to be applied is appropriately set depending on the size of molded glass article 26 to be manufactured. Further, a drive means to shift upper mold 10b up and down is not specifically limited, and a drive means well known in the art such as an air cylinder, an oil pressure cylinder and an electric cylinder utilizing a servo motor may be selectively utilized, as desired.

Thereafter, upper mold 10b is withdrawn upward and molded glass article 26 having been solidified is collected (Step S306), whereby molded glass article 26 is completed. Then, in order to successively manufacture molded glass article 26, lower mold is shifted to dropping position P1 again (Step S302) and the following steps are repeated. Herein, a method for manufacturing a molded glass article of this embodiment may includes processes other than those explained here. For example, provided may be a process to inspect the form of molded glass article 26 before collecting molded glass article 26, or a process to clean lower mold 10a or upper mold 10b after collecting molded glass article 26.

While repeating manufacture of molded glass article 26 in this manner, the surface of lower mold 10a and upper mold 10b are oxidized to form a layer of chromium oxide. However, because lower mold 10a and upper mold 10b of this embodiment are provided with protective film 13 having I(110) higher than I(200), increase of surface roughness due to crystal growth of chromium oxide can be restrained, and allowing long term use of lower mold 10a and upper mold 10b without deteriorating surface roughness of molded glass article 26.

In this embodiment, protective film containing chromium has an X-ray diffraction intensity of (110) plane of chromium higher than a diffraction intensity of (200) plane of chromium. Therefore, the increase of surface roughness due to crystal growth of chromium oxide is restrained, ant thereby allow long term use of a molding die without deteriorating the surface roughness of a glass gob or a molded glass article.

Molded glass article 26 manufactured by a manufacturing method of this embodiment can be utilized as various optical elements such as a picture taking lens of a digital camera, an optical pickup lens of a DVD and a coupling lens for optical communication. Further, it can be also utilized as a glass preform used for manufacture of various optical elements by the reheat press method.

EXAMPLES

In the following, examples having been performed to confirm the advantages of this invention will be explained; however, this invention is not limited thereto.

(Preparation of Molding Die)

Four kinds of molding dies (examples 1-3 and comparative example 1), in which the sputtering gas pressures at the time of deposition of protective film 13 are different, were prepared. A sintered substance of silicon carbide (SiC) was utilized as a material of substrate 11, and the form of molding surface 15 was a plane. Further, a material of intermediate film 12 and protective film 13 was chromium (Cr). Deposition of intermediate film 12 and protective film 13 was performed by the sputtering method. As a sputtering system, a sputtering system of a parallel plate type which is shown in FIG. 6 was utilized. As target 33, a chromium target having a diameter of 152 mm (6 inches) was utilized and the distance (D) between target 33 and the deposition surface was set to 65 mm.

First, substrate 11 was set on substrate holder 36, and vacuum chamber 31 was evacuated at a degree of vacuum of an order of $10^{-3}$ Pa while heating substrate 11 at 350° C. by heater 37. Thereafter, argon gas as a sputtering gas was introduced at 0.3 Pa, and high frequency electric power of 500 W was applied to deposit chromium film (intermediate film 12) of 0.35 μm (Step S101). The pressures of a sputtering gas at the time of depositing intermediate film 12 were identical for all the 4 kinds. Then, the pressures of argon gas was gradually changed to 0.9 Pa (example 1), 1.3 Pa (example 2) and 1.5 Pa (example 3) taking approximately 1 minute, respectively, while keeping application of high frequency electric power, and chromium film (protective film 13) of 0.35 μm was succeedingly deposited (Step S102). As for comparative example 1, after deposition of intermediate film 12, chromium film (protective film 13) of 0.35 μm was deposited without changing the pressure (0.3 Pa) of argon gas.

Next, X-ray diffraction pattern of the surface of protective film 13 having been deposited under each condition was measured, and diffraction peak intensity I(110) of (110) plane of chromium and diffraction peak intensity I(200) of (200) plane of chromium were measured. The measurement was performed by use of X-ray diffractometer RINT2500, manufactured by Rigaku Corp., under a condition of a range of 0-80°, a sampling width of 0.02° and a scanning rate of 5°/min according to a θ-2θ method. I(110) was higher than I(200) in examples 1-3, while I(110) was lower than I(200) in comparative example 1. The measured I(110) and I(200) will be shown in table 1.

TABLE 1

| | Pressure of Argon Gas (Pa) | I(110) (cps) | I(200) (cps) | Arithmetic Mean Roughness Ra (μm) | | | |
|---|---|---|---|---|---|---|---|
| | | | | Before Molding | After Manufacture of 2000 Pieces | After Manufacture of 4000 Pieces | After Manufacture of 6000 Pieces |
| Example 1 | 0.9 | 9500 | 750 | 0.010 | 0.012 | 0.015 | 0.018 |
| Example 2 | 1.3 | 820 | 60 | 0.010 | 0.011 | 0.013 | 0.014 |
| Example 3 | 1.5 | 3400 | 45 | 0.010 | 0.011 | 0.012 | 0.013 |
| Comparative Example 1 | 0.3 | 1080 | 9700 | 0.003 | 0.015 | 0.036 | 0.062 |

Figure 2D:
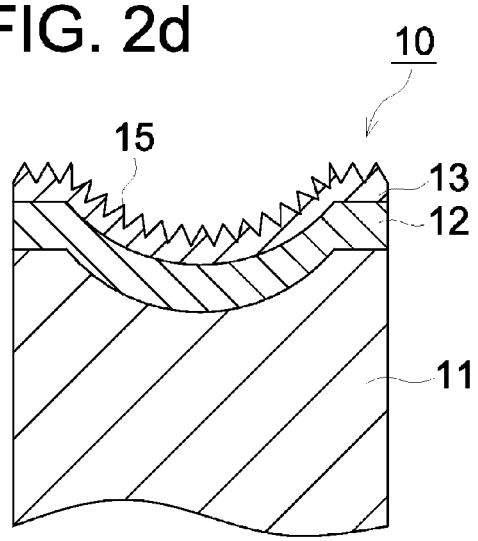

Next, the surface of protective film 13 was immersed into etching solution to be subjected to a roughening treatment (Step S103, refer to FIG. 2d). As the etching solution, chromium etching solution (ECR-2, manufactured by Nacalai Tesque Inc.), which is available on the market and contains ammonium ceric nitrate, was utilized. The etching was performed so as to make an arithmetic mean roughness (Ra) of the surface of protective film after etching to be 0.01 μm. However, as for comparative example 1, etching was stopped at an arithmetic mean roughness of 0.003 μm because the progress of roughening by etching was extremely slow. Herein, the arithmetic mean roughness (Ra) was measured by use of AFM (D3100, manufactured by Digital Instruments, Inc.).

(Manufacture of Molded Glass Article)

Molded glass articles were manufactured according to the flow chart shown in FIG. 7 by use of 4 kinds of molding dies, which were prepared in the above-described manner, as lower mold 10a. The outer diameter of glass article was 7 mm, and the thickness at the center portion was 3.5 mm. The glass material utilized was a phosphate type having a Tg of 480° C. The temperature in the neighborhood of the top portion of dropping nozzle 23 was set to 1,000° C. so as to drop molten glass droplet 20 of approximately 190 mg. Further, the heating temperature in Step S301 was set to 500° C. for lower mold 10a and 450° C. for upper mold 10b, and the load of compression in Step S305 was set to 1,800 N. Herein, upper mold 10b was provided with intermediate film 12 and protective film 13 under the same condition as example 1 and the surface was subjected to roughening.

By utilizing 4 kinds of lower molds 10a, each 6,000 pieces of molded glass articles were produced. The arithmetic mean roughness (Ra) of the surface of protective film 13 was measured at each stage after production of 2,000 pieces, 4,000 pieces and 6,000 pieces, respectively. The measurement results are also shown in table 1. In the case of comparative example 1, the arithmetic mean roughness (Ra) was increased up to 0.36 μm after 4,000 pieces preparation and 0.062 μm after 6,000 pieces preparation. On the other hand, any of examples 1-3 showed the arithmetic mean roughness of less than 0.02 μm even after production of 6,000 pieces, and it has been confirmed that increase of surface roughness due to crystal growth of chromium oxide is effectively restrained.

What is claimed is:

1. A molding die for manufacturing a glass gob or a molded glass article, the molding die comprising:
   a substrate having a molding surface;
   a protection film containing chromium formed on the molding surface, in which protection film, an X-ray diffraction peak intensity of (110) plane of chromium is higher than an X-ray diffraction peak intensity of (200) plane of chromium, and a surface of the protection film is roughened to have an arithmetic mean roughness of no less than 0.005 μm and no more than 0.05 μm; and
   an intermediate film containing chromium formed between the substrate and the protection film, in which intermediate film, an X-ray diffraction peak intensity of (110) plane of chromium is no higher than an X-ray diffraction peak intensity of (200) plane of chromium.

2. A method for manufacturing a molding die for manufacturing a glass gob or a molded glass article, the method comprising the steps of:
   forming a protection film containing chromium on a molding surface of a substrate, in which protection film, an X-ray diffraction peak intensity of (110) plane of chromium is higher than an X-ray diffraction peak intensity of (200) plane of chromium;
   roughening a surface of the protection film to have an arithmetic mean roughness of no less than 0.005 μm and no more than 0.05 μm; and
   before the step of forming a protection film, forming an intermediate film on the surface of the substrate, in which intermediate film, an X-ray diffraction peak intensity of (110) plane of chromium is no higher than an X-ray diffraction peak intensity of (200) plane of chromium.

3. The method for manufacturing a molding die of claim 2, wherein the protection film and the intermediate film are both formed by a sputtering method, and sputtered particles have lower energy when reaching a deposition surface under a deposition condition for depositing the protection film than under a deposition condition for depositing the intermediate film.

4. The method for manufacturing a molding die of claim 3, where a pressure of a sputtering gas in a vacuum chamber is higher under the deposition condition for depositing the protection film than under the deposition condition for depositing the intermediate film.

5. The method for manufacturing a molding die of claim 2, the method comprising the step of:
   roughening the surface of the protection film by etching.

6. A method for manufacturing a glass gob, the method comprising the steps of:
   dropping a droplet of molten glass onto the molding die of claim 1; and
   cooling and solidifying the dropped droplet of molten glass on the molding die.

7. A method for manufacturing a molded glass article, the method comprising the steps of:
   dropping a droplet of molten glass on a first molding die; and
   press-molding the dropped droplet of molten glass with the first molding die and a second molding die,
   wherein at least one of the first molding die and the second molding die is the molding die of claim 1.

* * * * *